United States Patent
Park et al.

(10) Patent No.: US 11,793,006 B2
(45) Date of Patent: Oct. 17, 2023

(54) MEMRISTOR DEVICE, METHOD OF FABRICATING THEREOF, SYNAPTIC DEVICE INCLUDING MEMRISTOR DEVICE AND NEUROMORPHIC DEVICE INCLUDING SYNAPTIC DEVICE

(71) Applicants: SK hynix Inc., Gyeonggi-do (KR); Korea Advanced Institute of Science and Technology, Daejeon (KR)

(72) Inventors: Sangsu Park, Gyeonggi-do (KR); Sung-Yool Choi, Daejeon (KR); Sung Gap Im, Daejeon (KR); Sang Yoon Yang, Sejong-si (KR); Jungyeop Oh, Daejeon (KR)

(73) Assignees: SK hynix Inc., Gyeonggi-do (KR); Korea Advanced Institute of Science and Technology, Daejeon (KR)

( * ) Notice: Subject to any disclaimer, the term of this patent is extended or adjusted under 35 U.S.C. 154(b) by 191 days.

(21) Appl. No.: 17/394,276

(22) Filed: Aug. 4, 2021

(65) Prior Publication Data
US 2022/0045289 A1    Feb. 10, 2022

(30) Foreign Application Priority Data
Aug. 5, 2020   (KR) .................. 10-2020-0098219

(51) Int. Cl.
| | |
|---|---|
| *H01L 51/50* | (2006.01) |
| *H10K 10/50* | (2023.01) |
| *G06N 3/065* | (2023.01) |
| *H10K 10/82* | (2023.01) |
| *H10K 19/00* | (2023.01) |
| *H10K 71/10* | (2023.01) |
| *H10K 85/10* | (2023.01) |

(52) U.S. Cl.
CPC ............ *H10K 10/50* (2023.02); *G06N 3/065* (2023.01); *H10K 10/82* (2023.02); *H10K 19/202* (2023.02); *H10K 71/10* (2023.02); *H10K 85/111* (2023.02); *H10K 85/151* (2023.02)

(58) Field of Classification Search
CPC ..... H10K 10/50; H10K 85/111; H10K 85/151
See application file for complete search history.

(56) References Cited

U.S. PATENT DOCUMENTS

| | | | |
|---|---|---|---|
| 10,538,618 B2 | 1/2020 | Gilroy et al. | |
| 2019/0214557 A1 | 7/2019 | Bahar | |

FOREIGN PATENT DOCUMENTS

KR    10-1973110 B1    4/2019

*Primary Examiner* — Anthony Ho
(74) *Attorney, Agent, or Firm* — IP & T GROUP LLP (57) ABSTRACT

Disclosed are a memristor device, a method of fabricating the same, a synaptic device including a memristor device, and a neuromorphic device including a synaptic device. The disclosed memristor device may comprise a first electrode, a second electrode disposed to be spaced apart from the first electrode; and a resistance changing layer including a copolymer between the first electrode and the second electrode. The copolymer may be a copolymer of a first monomer and a second monomer, and the first polymer formed from the first monomer may have a property that diffusion of metal ions is faster than that of the second polymer formed from the second monomer. The second polymer may have a lower diffusivity of metal ions as compared with the first polymer. The first monomer may include vinylimidazole (VI). The second monomer may include 1,3,5-trivinyl-1,3,5-trimethylcyclotrisiloxane (V3D3). The copolymer may include p(V3D3-co-VI).

12 Claims, 6 Drawing Sheets

MEMRISTOR DEVICE, METHOD OF FABRICATING THEREOF, SYNAPTIC DEVICE INCLUDING MEMRISTOR DEVICE AND NEUROMORPHIC DEVICE INCLUDING SYNAPTIC DEVICE

CROSS-REFERENCES TO RELATED APPLICATION

The present application claims the benefit of Korean application number 10-2020-0098219, filed on Aug. 5, 2020, which is herein incorporated by reference in its entirety.

BACKGROUND OF THE INVENTION

1. Field

The present invention relates to an electronic device and its applications, and more particularly, to a memristor device, a method of fabricating thereof, and a synaptic device including the memristor device and a neuromorphic device including the synaptic device.

2. Description of the Related Art

With the rapid development of software and hardware, artificial intelligence (AI) technologies such as real-time video analysis, image recognition, and language translation are emerging. However, the conventional artificial neural network based on a GPU (graphical processing unit) computing device uses the Von Neumann architecture in which the memory and the processor are separated discretely so that there is an inefficiency in terms of energy consumption. In this view, a software-based artificial neural network system using a cloud server is being utilized without directly performing an artificial intelligence-based algorithm calculation on a portable terminal. When using the cloud server as described above, there arise concerns such as a relatively long latency (i.e., queue time) and security issues. Therefore, an alternative technology capable of implementing an artificial neural network directly on a portable terminal is still desired. Accordingly, as the alternative technology to the von Neumann architecture, research to implement biomimetic computing by using analog memory devices is being conducted.

Memristor is a compound device having both memory and resistance characteristics, and this device is a two-terminal device whose resistance state can be changed by external electrical stimulation such as voltage and/or current signal. In particular, memristors have a simple structure and have been studied for integrated memory applications. In addition, the memristor may simultaneously implement memory and computational functions and simulate the synaptic role of the brain. Memristors may be largely classified into two types; one type is OxRAM (oxide-based RAM), which forms a conductive path by oxygen voids in a metal oxide film, and the other type is a conductive bridge RAM (CBRAM) which forms a conductive path through penetration of metal ions into the electrolyte.

CBRAM has advantages such as fast operation speed, high possibility of miniaturization, freedom degree of selecting electrolyte medium, and high ON/OFF ratio. However, with CBRAM, it is difficult to implement the gradual collapse of the conductive filament due to the strong interaction between the metals in the conductive filament when the conducting filament is contact with a lower electrode and an upper electrode to connect the electrodes. Therefore, CBRAM has a disadvantage that it is difficult to implement the characteristics based on analog switching.

Therefore, there is a need to develop a new method of controlling a conductive filament capable of implementing reliable analog switching characteristics. In addition, development of a new device (which may improve the recognition rate of a neuromorphic system by suppressing the asymmetric synaptic characteristics caused by the rapid formation or breaking of the filaments inside the memristor with respect to the pulse voltage for synaptic potentiation and depression) is desired.

SUMMARY OF THE INVENTION

In one embodiment, the present invention can provide a memristor device having excellent and stable synaptic properties and in another embodiment can provide a memristor device having excellent analog switching characteristics and substantially symmetric synaptic characteristics.

In addition, the present invention in one embodiment can provide a method of fabricating the memristor device.

In addition, the present invention in one embodiment can provide a synaptic device including the memristor device.

In addition, the present invention in one embodiment can provide a neuromorphic device including the synaptic device described above.

The present invention addresses not only those concerns and difficulties mentioned above, but also other concerns that are not mentioned but which would be understood by those skilled in the art from the following description.

According to one embodiment of the present invention, there is provided a polymer memristor device which comprises a first electrode, a second electrode disposed to be spaced apart from the first electrode, and a resistance changing layer including a copolymer between the first electrode and the second electrode, and the copolymer may be a copolymer of a first monomer and a second monomer, and a first polymer which is formed from the first monomer is a polymer having a property that diffusion of metal ions thereof is faster than that of a second polymer which is formed from the second monomer, and the second polymer has a lower diffusivity of metal ions than that of the first polymer.

The first monomer may include vinylimidazole (VI). The first polymer may include polymerized VI (pVI).

The second monomer may include 1,3,5-trivinyl-1,3,5-trimethylcyclotrisiloxane (V3D3). The second polymer may include polymerized V3D3 (pV3D3).

The first monomer may include VI, the second monomer may include V3D3, and the copolymer may include p(V3D3-co-VI).

The content of the first monomer in the copolymer may be about 15% to 70%.

The content of the first monomer in the copolymer may be about 20% to 55%.

One of the first electrode and the second electrode may be an inert electrode, and the other may be an active electrode.

The inert electrode may include at least any one selected from Al and Pt.

The active electrode may include at least any one selected from Cu, Ag, and Ni.

The resistance change layer may be a single layer made of the copolymer, the first electrode may be in contact with a first surface of the single layer, and the second electrode may be in contact with a second surface facing the first surface of the single layer.

The resistance change layer may have a thickness of about 5 nm to 100 nm.

According to another embodiment of the present invention, there is provided a method of fabricating a polymer memristor device which comprises forming a first electrode; forming a resistance changing layer including a copolymer on the first electrode; and forming a second electrode on the resistance change layer, and wherein the copolymer is a copolymer of a first monomer and a second monomer, and the first polymer composed of the first monomer is a polymer having a property that diffusion of metal ions thereof is faster than that of the second polymer composed of the second monomer, and the second polymer has a lower diffusivity of metal ions than the first polymer.

The resistance change layer may be formed by an initiated chemical vapor deposition (iCVD) process.

The first monomer may include VI.

The second monomer may include V3D3.

The copolymer may include p(V3D3-co-VI).

The content of the first monomer in the copolymer may be about 15% to 70%.

The content of the first monomer in the copolymer may be about 20% to 55%.

One of the first electrode and the second electrode may be an inert electrode, and the other may be an active electrode.

According to another embodiment of the present invention, a synaptic device including the memristor device described above is provided.

According to another embodiment of the present invention, a neuromorphic device including the synaptic device described above is provided.

According to these embodiments of the present invention, a memristor device having excellent and stable synaptic properties may be implemented by a resistance change layer including a copolymer having a different degree of diffusion of metal ions between the first electrode and the second electrode. In addition, a memristor device having excellent analog switching characteristics and substantially symmetric synaptic characteristics may be realized. The memristor device according to these embodiments may have a relatively simple structure and may be fabricated by a relatively simple process, and performance uniformity between devices may be improved.

If the memristor device according to these embodiments is applied, a synaptic device and a neuromorphic device having excellent performance may be implemented.

DETAILED DESCRIPTION OF THE INVENTION

Hereinafter, exemplary embodiments of the present invention will be described in detail with reference to the accompanying drawings.

The embodiments of the present invention to be described below are provided to describe the present invention to those having a common knowledge in the related art, and the scope of the present invention is not limited by the following embodiments, and the following embodiments may be modified in many different forms.

The terminology used herein is used to describe a specific embodiment and is not intended to limit the present invention. As used herein, a singular form may include plural forms unless the context clearly indicates otherwise. Also, as used herein, the term such as "comprise" and/or "comprising" specifies the mentioned shapes, numbers, steps, actions, members, elements and/or the presence of these groups, and does not exclude the presence or addition of one or more other shapes, numbers, actions, members, elements and/or presence or addition of groups. In addition, the terminology, "connection" used in the present specification means not only that certain members are directly connected, but also includes indirect connection configured by further interposing other members between the members.

In addition, in the present specification, when a member is positioned "on" another member, this includes not only the case where the member is in contact with the other member, but also the case where another member exists between the two members. The term, "and/or" as used herein includes any one, and all combinations of one or more of the corresponding listed items. In addition, as used herein, terms such as "about", "substantially" and the like are used as a range of numerical values or degrees or a meaning close thereto, in consideration of routine fabricating and material tolerances, and are provided to aid understanding of the present application. Accurate or absolute numerical values are merely provided to aid in the understanding of this application.

Hereinafter, the embodiments of the present invention will be described in detail with reference to the accompanying drawings. The size or the thickness of regions or parts shown in the accompanying drawings may be somewhat exaggerated for clarity of the specification and convenience of description. The same reference numerals denote the same elements throughout the detailed description.

Figure 1:
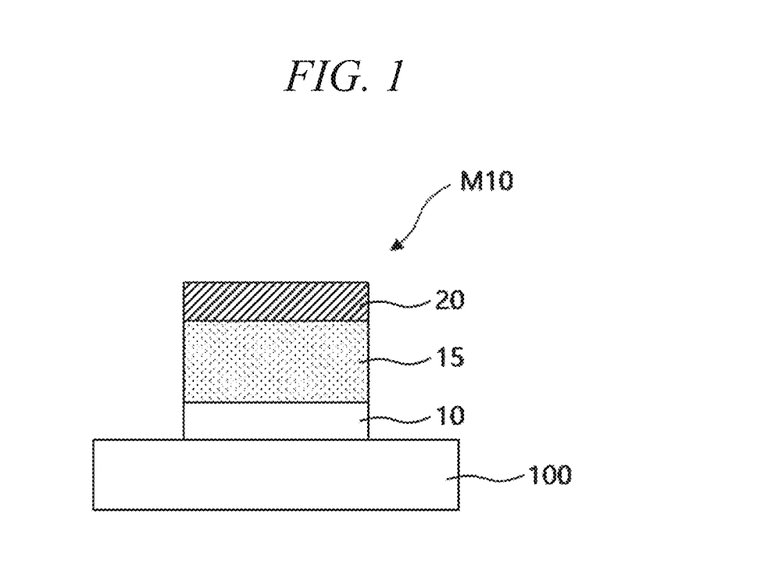
FIG. 1 is a cross-sectional diagram showing a memristor device M10 according to one embodiment of the present invention.

FIG. 1 is a cross-sectional diagram showing a memristor device M10 according to one embodiment of the present invention.

Referring to FIG. 1, the memristor device M10 may be provided on a predetermined substrate 100. The substrate 100 may include a semiconductor or an insulator, and various substrate materials may be applied. The memristor device M10 may comprise a first electrode 10, a second electrode 20 disposed to be spaced apart from the first electrode 10, and a resistance change layer 15 including a copolymer arranged between the first electrode 10 and the second electrode 20. The resistance change layer 150 may be referred to as a kind of electrolyte layer or solid electrolyte layer. The memristor device M10 may have a configuration in which the first electrode 10, the resistance change layer 15, and the second electrode 20 are sequentially stacked on the substrate 100.

The copolymer constituting the resistance change layer 15 may be a copolymer of a first monomer and a second monomer. The first polymer of the copolymer to be formed from the first monomer may have a property having a faster diffusivity of metal ions as compared with the second polymer to be formed from the second monomer. In addition, the first polymer of the copolymer may have higher metal ion conductivity than the second polymer of the copolymer. Therefore, depending on the components and/or content of the first monomer (or the first polymer) and the second monomer (or the second polymer) in the resistance change layer 15 (that is, the electrolyte layer), the degree of diffusivity of metal ions may be adjusted. In addition, the memristor device M10 may have excellent and stable synaptic properties since the resistance change layer 15 including the above-described copolymer is employed. In this regard, the memristor device M10 may exhibit excellent analog switching characteristics and substantially symmetric synaptic characteristics. In addition, the memristor device M10 may exhibit synaptic characteristics with high reliability, and may also have excellent performance uniformity between devices. These features will be described in more detail later with reference to FIGS. 2, 5, 6, and the like.

In the copolymer constituting the resistance change layer 15, the first monomer may include, for example, VI (vinylimidazole). The first polymer may include pVI, i.e., polymerized VI. In the copolymer, the second monomer may include, for example, V3D3(1,3,5-trivinyl-1,3,5-trimethyl-cyclotrisiloxane). The second polymer may include pV3D3, i.e., polymerized V3D3. The first monomer may be VI, and the second monomer may be V3D3, and in this case, the copolymer may be p(V3D3-co-VI). Therefore, the resistance change layer 15 may be formed of, for example, p(V3D3-co-VI). The copolymer may basically have the properties of an electrical insulator. The entire copolymer in which the first monomer and the second monomer are copolymerized may have a random copolymer structure, while the present examples are not limited thereto.

The content of the first monomer (e.g., VI) in the copolymer may be, for example, about 15 to 70%. The percentages referred to herein refer to molecular content percentages calculated from Equation 1 below, and will be simply referred to hereinafter by the % sign. This case of 15 to 70% for the content of the first monomer may be advantageous in securing excellent and stable synaptic properties. In another example, the content of the first monomer (e.g., VI) in the copolymer may be, for example, about 20 to 55% or about 25 to 45%. The case of about 20 to 55% or 25 to 45% may be advantageous in securing excellent and stable synaptic properties.

In the present specification, the content of the first monomer (e.g., VI) refers to a molecular ratio of the first monomer (e.g., VI) to the second monomer (e.g., V3D3). For example, since V3D3 contains 3 silicon (Si) atoms and VI contains 2 nitrogen (N) atoms, one may use this information about the chemical constituents to calculate the molecular ratio of the two monomers. In the copolymer, when the first monomer is VI and the second monomer is V3D3, the formation of a copolymer [i.e., p(V3D3-co-VI)] by a combination thereof may be expressed as in Chemical Formula 1 as below, and the VI content (%) in the copolymer may be expressed as in Equation 1 as below, where the atomic % of N and the atomic % of Si are obtained from, X-ray photoelectron spectroscopy (XPS) or energy dispersive spectroscopy (EDS), Auger electron spectroscopy (AES) and secondary ion mass spectroscopy (SIMS), nuclear reaction analysis (NRA) and Rutherford backscattering spectroscopy (RBS), which are non-limiting examples. This calculation discussed here and shown in Equation 1 will be referred to herein as a molecular ratio percentage calculation.

[Chemical Formula 1]

$$VI\ contents\,(\%) = 100 \times \frac{\text{Atomic \% of N} \div 2}{\text{Atomic \% of N} \div 2 + \text{Atomic \% of Si} \div 3}$$ [Equation 1]

One of the first electrode 10 and the second electrode 20 may be an inert electrode, and the other may be an active electrode. For example, the first electrode 10 may be an inert electrode, and in this case, the second electrode 20 may be an active electrode. However, the positions of the inert electrode and the active electrode may be reversely changed.

The first electrode 10 may be an inert electrode, and in this case, the inert electrode may include, for example, at least any one selected from Al and Pt. The second electrode 20 may be an active electrode, and in this case, the active electrode may include, for example, at least any one selected from Cu, Ag, and Ni. As a specific example, the first electrode 10 may contain Al as an inert electrode, and the second electrode 20 may contain Cu as an active electrode. However, this is only exemplary, and the specific material (a metal, a metallic material) contained in the inert electrode and the specific material (a metal, a metallic material) of the active electrode may be altered.

In connection with the first electrode 10 and the second electrode 20, the metal ions of an electrode (e.g., electrode 20) corresponding to the active electrode may drift within the resistance change layer 15. Depending on the voltage applied between the first electrode 10 and the second electrode 20, metal ions of the electrode (e.g., 20) corresponding to the active electrode move within the resistance change layer 15 to form a conductive filament. Depending on the intensity of or the number of times of application of voltage to the electrodes, the degree of movement of the metal ions may vary, and as a result, the resistance of the resistance change layer 15 may vary.

In one embodiment of the present invention, the resistance change layer 15 may be a single layer formed from the copolymer. The first electrode 10 may be in contact with, for example, in direct contact with the first surface, for example, a lower surface of the single layer 15, and the second electrode 20 may be the single layer 15 may be in contact with, for example, in direct contact with a second surface, for example, an upper surface facing the first surface. In other words, the resistance change layer 15 may be formed as a single layer instead of multiple layers, and excellent and stable synaptic characteristics may be implemented by using the resistance change layer 15 of a single layer type. Accordingly, as compared with the case of using a multi-layer type of resistance change layer, the fabrication process according to one embodiment may be simplified, and it is relatively straightforward to fabricate a device with reproducibility, so it may be advantageous to increase the performance uniformity between memristor devices.

The thickness of the resistance change layer 15 may have a range of, for example, about 5 nm to 100 nm, or about 5 nm to 80 nm. When the resistance change layer 15 has the above-described thickness range, it may be advantageous to secure the required resistance change characteristics of the resistance change layer 15. When the thickness of the resistance change layer 15 is reduced to less than about 5 nm, it may be difficult to maintain the insulation of the thin film, i.e., the resistance change layer 15. When the thickness of the resistance change layer 15 is thicker than about 100 nm, it may be difficult to form a filament in the thin film, i.e., in the resistance change layer 15. When a memristor is based on a conventional pV3D3, when the thickness of the pV3D3 thin film is increased to about 40 nm or more, the insulation property is excessively increased, and thus formation of a filament by virtue of a copper penetration phenomenon may be difficult. On the other hand, in one embodiment of the present invention, it is possible to intentionally lower the insulation of the thin film, i.e., the resistance change layer 15 by reducing the density of the thin film, i.e., of the resistance change layer 15 such as for example through a method of increasing the deposition rate of the iCVD (initiated chemical vapor deposition) process, and device operations may be possible even if a thickness of the resistance change layer 15 is thick (e.g., between XX and XX nm). However, the thickness range is exemplary and may be changed.

Accordingly, the resistance change layer 15 may be formed by the iCVD process. The fabricating process using iCVD will be described in more detail later.

Figure 2:
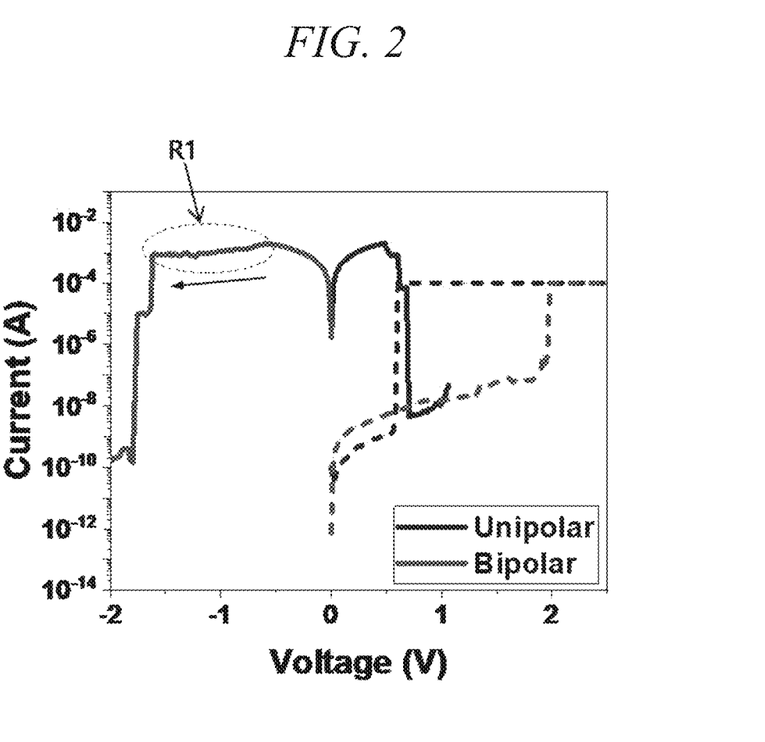
FIG. 2 is a graph showing voltage-current characteristics of a memristor device according to a present example.

FIG. 2 is a graph showing voltage-current characteristics of a memristor device according to a present example. Here, the memristor device according to this example has the structure of FIG. 1, and the resistance change layer may be formed from a p(V3D3-co-VI) copolymer, and the content of VI in the copolymer is 36.6%, which is calculated from Equation 1. In this case, Al layer was applied as the first electrode and Cu layer was applied as the second electrode. The thickness of the resistance change layer was about 20 nm. Here, the voltage shown on FIG. 2 means a voltage applied between the first electrode and the second electrode.

Referring to FIG. 2, a process in which the resistance state of the memristor device changes from a high resistance state (i.e., a reset state) to a low resistance state (i.e., a set state) is referred to as set switching, and a process in which the resistance state of the memristor device changes from a low resistance state (i.e., a set state) to a high resistance state (i.e., a reset state) is referred to as a reset switching. When the set and reset switching occur at the same voltage polarity, it is called unipolar switching, and when the set and reset switching occur at different voltage polarity, it is called bipolar switching. In FIG. 2, both of the unipolar switching characteristics and the bipolar switching characteristics are illustrated with the set switching indicated by a dotted line and the reset switching indicated by a solid line.

The area indicated by R1 in FIG. 2 indicates an area in which the current is changed in an analog manner, that is, the current is gradually reduced, when the applied voltage is increased in the negative (−) direction in the set state (i.e., the process for reset). Hereinafter, this region R1 is referred to as a "first analog switching region." According to one embodiment example, the first analog switching region R1 may appear long or wide over a considerably wide voltage section, and may appear generally straight, or in a curved shape close to a straight line. When the applied voltage is increased in the negative (−) direction in the set state, the current/resistance gradually changes linearly over a considerably long region, and then a sudden increase in resistance, that is, the reset switching may occur.

In one embodiment, the characteristics of the first analog switching region R1 shown in FIG. 2 may be utilized. Regarding the characteristics of the first analog switching region R1, according to one embodiment, a memristor device having excellent and stable synaptic characteristics may be implemented. In addition, a memristor device having excellent analog switching characteristics, and symmetrical and linear synaptic characteristics may be implemented.

The characteristics of the first analog switching region R1, that is, the length or linearity of the R1 region may vary depending on the material composition of the copolymer applied to the resistance change layer. For example, when the resistance change layer is composed of a p(V3D3-co-VI) copolymer, characteristics of the R1 region may vary depending on the content of VI in the copolymer. In this regard, the content of VI in the p(V3D3-co-VI) copolymer may be, for example, about 15% to 70%, which is calculated from Equation 1. As a specific example, the content of VI may be preferably about 20% to 55% or about 25% to 45%, which is calculated from Equation 1.

Figure 3:
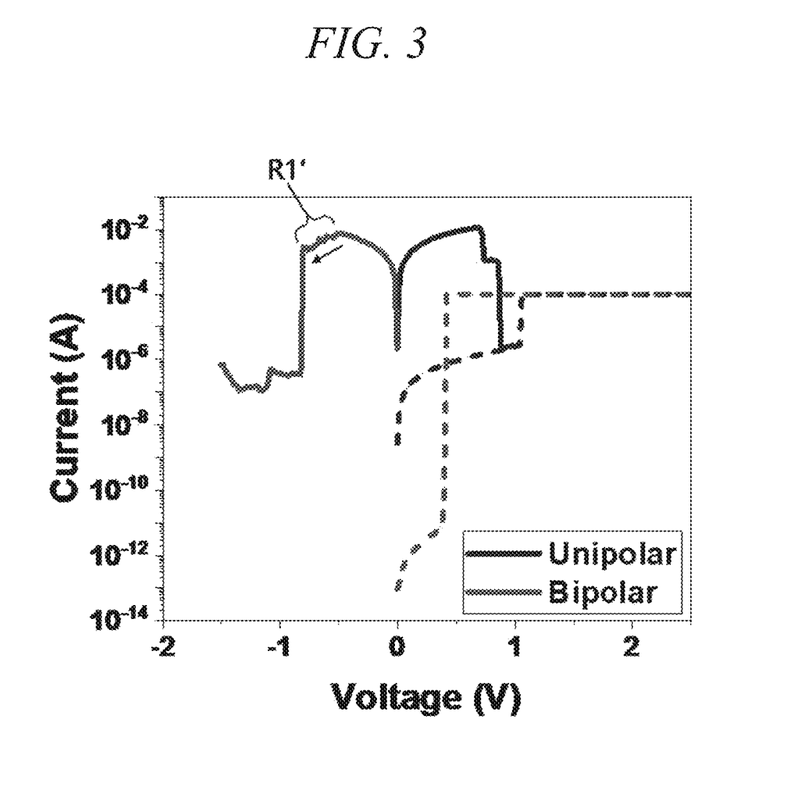
FIG. 3 is a graph showing voltage-current characteristics of a memristor device according to a comparative example.

FIG. 3 is a graph showing voltage-current characteristics of a memristor device according to a comparative example. The memristor device according to the comparative example has a structure in which a resistance change layer is provided between a first electrode and a second electrode similar to FIG. 1, and the resistance change layer is formed from a pV3D3 polymer. For the comparative example, Al layer was applied as the first electrode, Cu layer was applied as the second electrode, and the thickness of the resistance change layer was about 20 nm. There is a difference in that the resistance change layer of the memristor device according to the present example of FIG. 2 is composed of a p(V3D3-co-VI) copolymer, whereas the resistance change layer of the memristor device according to the comparative example of FIG. 3 is composed of a pV3D3 polymer.

Referring to FIG. 3, similarly as described in FIG. 2, the unipolar switching characteristic and the bipolar switching characteristic may be observed, and at this time, a set switching is indicated by a dotted line and a reset switching is indicated by a solid line. When a memristor device in which the resistance change layer is formed from a pV3D3 polymer rather than a copolymer, it may be confirmed by FIG. 3 that a length of a first region R1' corresponding to the first analog switching region R1 of FIG. 2 is relatively short, and since the change of current characteristic is unstable in this region R1', the graph has a nonlinear characteristic. Therefore, it may be difficult to implement excellent analog switching characteristics and symmetric and linear synaptic characteristics with the memristor device according to the comparative example.

Figure 4:
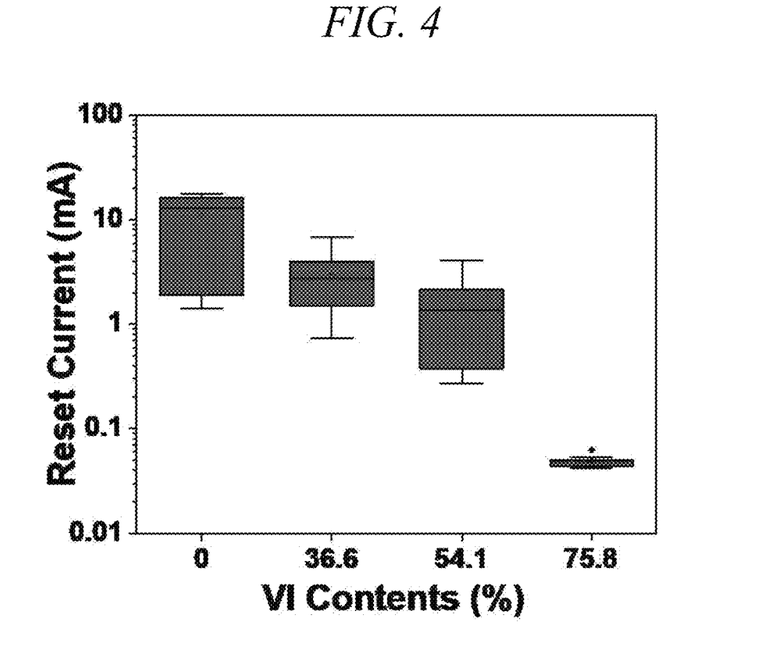
FIG. 4 is a graph showing a change in a reset current according to the composition of a resistance change layer of a memristor device according to a present example.

FIG. 4 is a graph showing a change in a reset current according to the composition of a resistance change layer of a memristor device according to another present example. Here, the memristor device according to the above example is the same as the example described in FIG. 2, but the properties for each sample were evaluated while changing the content of VI in the resistance change layer composed of the p(V3D3-co-VI) copolymer into 36.6%, 54.1%, and 75.8%, respectively, which are calculated from Equation 1. In addition, when the content of VI in FIG. 4 is 0%, the resistance change layer is a sample composed of pV3D3, which is the same as the comparative example described in FIG. 3. For each sample (a memristor device), a reset current was measured while performing a reset switching process of 10 cycles. Here, the reset current is a Joule heating reset current.

Referring to FIG. 4, the reset switching process of the memristor device according to this example in which the resistance change layer is formed from p(V3D3-co-VI) copolymer and the memristor device according to the comparative example in which the resistance change layer is formed from pV3D3 polymer may be caused by Joule heating. Here, the reset switching process may mean a reset switching process which occurs through regions indicated by R1 and R1' in FIGS. 2 and 3. The reset current of the memristor device (i.e., a sample having a content of VI larger than 0%) according to the present examples may be lower than the reset current of the memristor device according to the comparative example (i.e., a sample having a VI content of 0%). Also, as the content of VI increases in the memristor device according to the present examples is increasing, the reset current may decrease.

Figure 5:
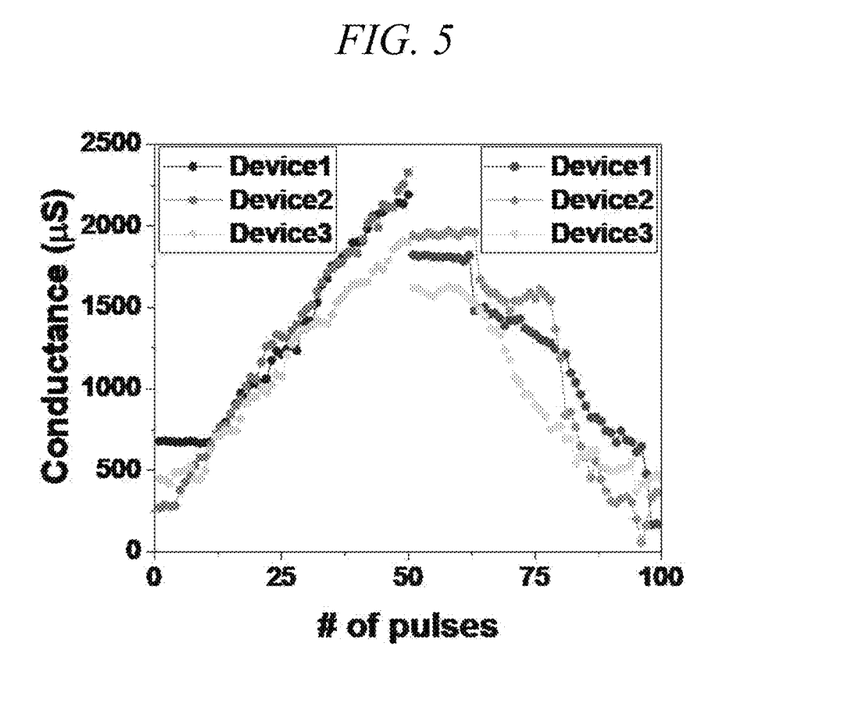
FIG. 5 is a graph (i.e., a P-D curve) showing a result of evaluating a potentiation-depression characteristic of a memristor device according to a present example.

FIG. 5 is a graph (i.e., a P-D curve) showing a result of evaluating a potentiation-depression characteristic of a memristor device according to yet another present example. Here, the memristor device according to the above example was the same as the example described in FIG. 2. That is, the resistance change layer of the memristor device according to the present example was composed of a p(V3D3-co-VI) copolymer, and the content of VI in the copolymer was 36.6%, which is calculated from Equation 1. Al layer was applied as the first electrode, Cu layer was applied as the second electrode, and the thickness of the resistance change layer was 20 nm. After fabricating three devices, i.e., Device 1, 2, and 3 under the same conditions, the potentiation-depression properties were evaluated for the three devices.

Referring to FIG. 5, the potentiation period is a period in which the number of pulses (#) is 1 to 50, and the depression period is a period in which the number of pulses is 51 to 100. In the potentiation section, as the number of pulses increases, the filaments in the resistance change layer are strengthened, and the conductivity may increase. In the depression period, as the number of pulses increases, the filaments in the resistance change layer are suppressed and the conductivity may decrease. The pulse in the potentiation period may be a positive current pulse, and the pulse in the depression period may be a negative voltage pulse. In addition, the pulse in the potentiation period may be an incremental pulse in which the intensity gradually increases in the positive (+) direction as the number increases, and the pulse in the depression period may be an incremental pulse in which the intensity gradually increases in the negative (−) direction as the number increases. Instead of the positive current pulse, a positive voltage pulse may be used.

The potentiation period may be a region in which conductivity gradually (linearly) increases according to an increase in the number of application of voltage pulses (positive current pulses) within the set state (e.g., first set state) of the memristor device according to the embodiment. The depression period may be a region in which conductivity gradually (linearly) decreases with an increase in the number of applications of voltage pulses (negative voltage pulses) within the set state (e.g., second set state) of the memristor device according to the embodiment. The depression period may correspond to the region R1 described with reference to FIG. 2, that is, the first analog switching region R1.

According to one embodiment of the present invention, a potentiation-depression graph, that is, a potentiation section and a depression section in a PD curve may form an approximately symmetrical shape, and each section may have relatively excellent linearity. In general, when the P-D curve has linear and symmetric characteristics, it may be said that the device has excellent and stable synaptic characteristics. Accordingly, the memristor device according to one embodiment has excellent and stable synaptic properties. The memristor device according to another embodiment may have excellent analog switching characteristics and substantially symmetric synaptic characteristics.

In addition, in the result of FIG. 5, as the variation between the devices, i.e., Devices 1, 2, 3 is not large and a relatively similar characteristic graph is obtained, it may be confirmed that the characteristic variation between memristor devices is small and relatively excellent uniformity may be secured according to the present example.

Figure 6:
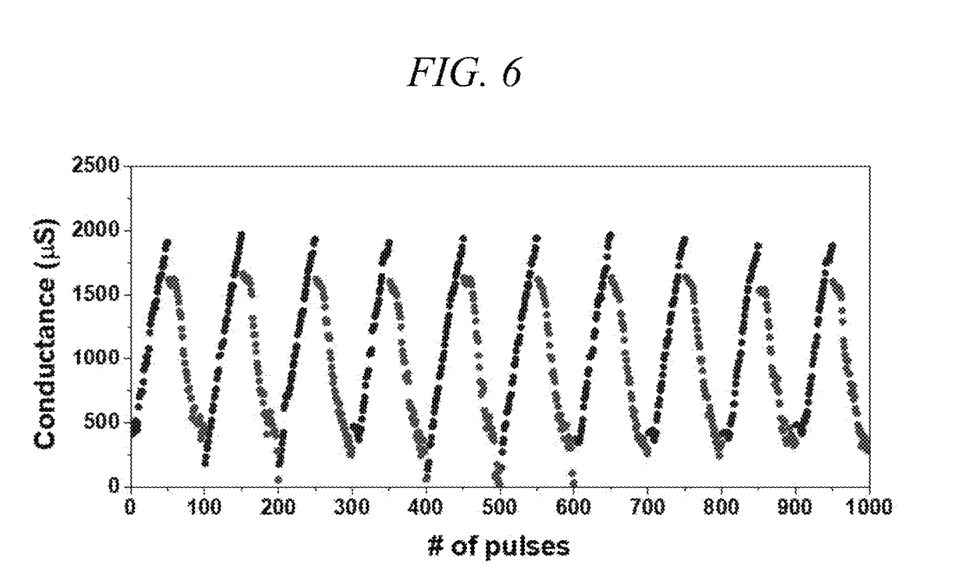
FIG. 6 is a graph showing results of iterative evaluation of potentiation-depression characteristics of a memristor device according to a present example.

FIG. 6 is a graph showing results of iterative evaluation of potentiation-depression characteristics of a memristor device according to yet another present example. Here, the memristor device according to the above example was the same as the embodiment described in FIG. 5. The potentiation-depression characteristics were repeatedly evaluated for one memristor device according to the example.

Referring to FIG. 6, it may be seen that, even if the potentiation-depression cycle is repeated, a symmetrical and linear potentiation-depression curve is well maintained. In other words, it may be seen that cycle-to-cycle variation is small, and excellent and stable synaptic properties are well maintained even if the cycle is repeated.

From the results of FIGS. 5 and 6, it may be confirmed that the memristor device according to one embodiment may exhibit a potentiation-depression curve characteristic having a generally or substantially symmetrical and linear shape, the deviation between devices and the deviation between cycles are small, and it may have excellent uniformity, stability and reliability. In the memristor device according to another embodiment, by appropriately adjusting the composition ratio of the copolymer constituting the resistance change layer, that is, the content ratio of the first monomer to the second monomer included in the copolymer, the negative voltage enhancement characteristics may be appropriately controlled. As a result, it is possible to implement excellent synaptic properties. In this regard, the content ratio of the first monomer, e.g., VI in the copolymer may be, for example, about 15% to 70%, about 20% to 55%, or about 25% to 45%, which are calculated from Equation 1. The latter case may be advantageous in securing excellent and stable synaptic properties.

Hereinafter, a method of fabricating a memristor device according to one embodiment of the present invention will be described.

A method of fabricating a memristor device according to this embodiment may comprise: forming a first electrode, forming a resistance changing layer including a copolymer on the first electrode, and forming a second electrode on the resistance changing layer. Here, the copolymer may be a copolymer of a first monomer and a second monomer, and the first polymer made of the first monomer has a property that diffusion of metal ions thereof is faster as compared with the second polymer made of the second monomer. In addition, the second polymer may have a lower diffusivity of metal ions than the first polymer.

The resistance change layer may be formed using an iCVD (initiated chemical vapor deposition) process. That is, the copolymer of the resistance change layer may be formed by an iCVD process. The iCVD process is a CVD process using an initiator, and a chain polymerization reaction using free radicals is used. In the iCVD process, a polymer thin film may be deposited on the surface of a substrate by vaporizing an initiator and a monomer to cause a polymer reaction in a gas phase.

In a present example, at least one selected from the group consisting of a peroxide compound and a benzophenone compound of Chemical Formulas 2 to 6 below may be used as the initiator.

[Chemical Formula 2]

[Chemical Formula 3]

[Chemical Formula 4]

[Chemical Formula 5]

[Chemical Formula 6]

In addition, in the iCVD process, a monomer having an electron donor and a non-polar monomer together with the initiator may be introduced into an iCVD reactor (chamber) to form the copolymer on the substrate. Here, the monomer having the electron donor may include, for example, vinylimidazole. The vinylimidazole may be 1-vinylimidazole. The non-polar monomer may include, for example, 1,3,5-trivinyl-1,3,5-trimethylcyclotrisiloxane. In the process for forming the copolymer by the iCVD process, the temperature of the substrate may be, for example, about 25° C. to 38° C., and the pressure in the reactor may be, for example, about 200 mTorr to 400 mTorr. In addition, the amount ratio (molar ratio) of the non-polar monomer, and the monomer having an electron donor may be about 1:0.01 to 1:100.

The copolymer formed by the iCVD process may include the first monomer and the second monomer. Here, the first monomer may include, for example, VI (vinylimidazole), and the second monomer may include, for example, V3D3 (1,3,5-trivinyl-1,3,5-trimethylcyclotrisiloxane). In addition, the copolymer may include, for example, p(V3D3-co-VI). The content of the first monomer (e.g., VI) in the copolymer may be, for example, about 15% to 70% or about 20% to 55% or about 25% to 45%, which are calculated from Equation 1. The latter case may be advantageous in securing excellent and stable synaptic properties.

Meanwhile, in the method of fabricating a memristor device according to one embodiment, one of the first electrode and the second electrode may be an inert electrode, and the other may be an active electrode. Specific examples of the inert electrode and the active electrode may be the same as described with reference to FIG. 1.

According to one embodiment, as described above, a memristor device may be easily fabricated using, for example, the iCVD process. However, specific process conditions or materials used in the fabricating method disclosed herein are exemplary, and may be variously altered depending on the cases.

Figure 7:
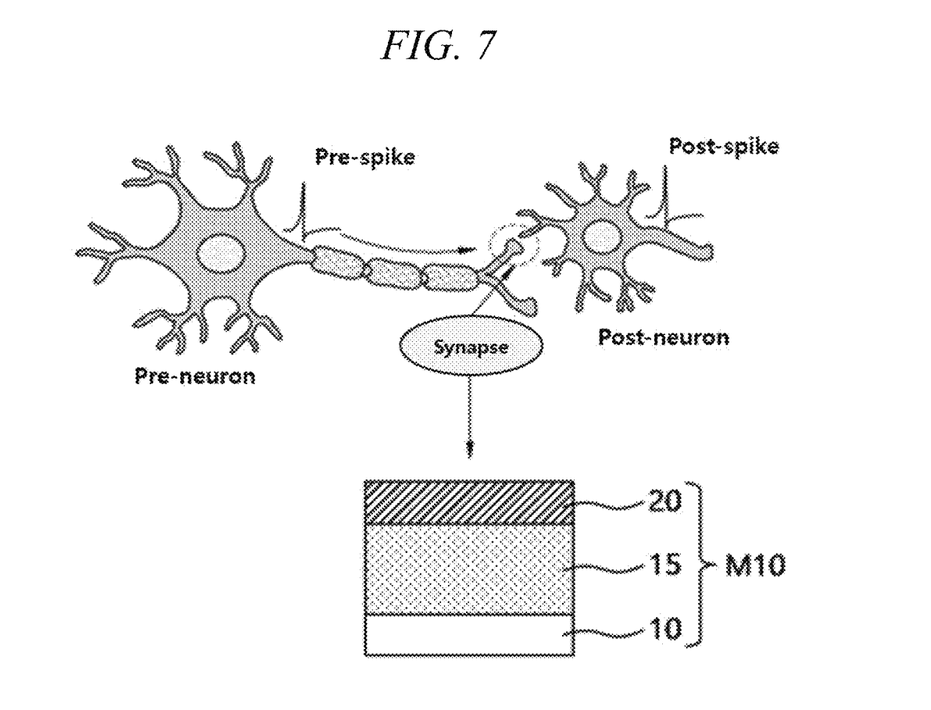
FIG. 7 is a conceptual diagram showing a memristor device according to one embodiment applied to a synaptic device.

FIG. 7 is a conceptual diagram showing an embodiment in which the memristor device M10 is applied to a synaptic device.

Referring to FIG. 7, when a synapse, which is a connection part between a pre-neuron and a post-neuron, is configured into a circuit, a memristor device M10 according to a present example may be applied. The pre-neuron may input a pre-spike signal to the synapse, and the synapse may transmit a predetermined synaptic signal to the post-neuron. The post-neurons may generate post-spike signals. Similar to synapses connecting pre-neurons and post-neurons, the memristor device M10 may play a role in connecting a pre-synaptic neuron circuit and a post-synaptic neuron. A circuit configuration is shown in FIG. 8.

Figure 8:
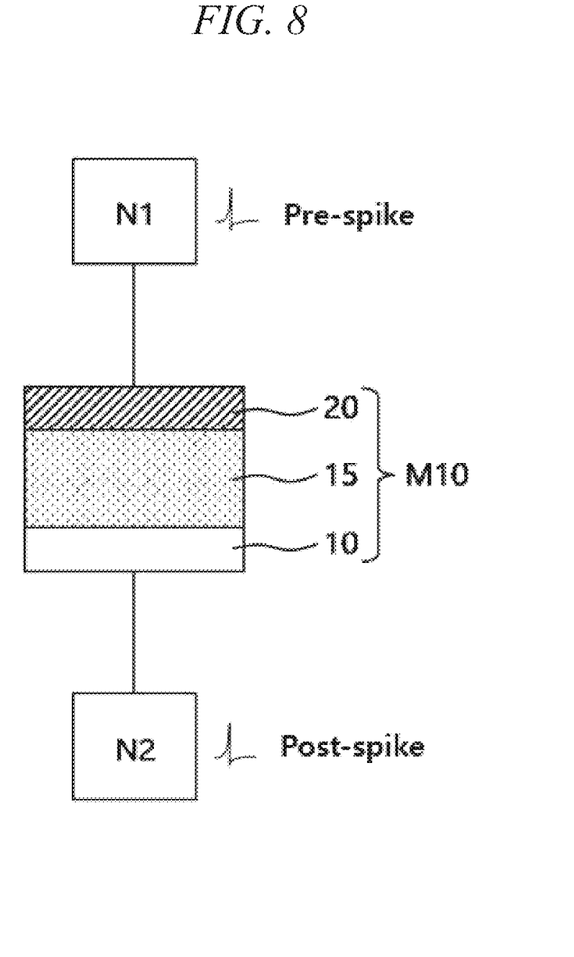
FIG. 8 is a cross-sectional diagram showing a synaptic device according to one embodiment of the present invention including a memristor device.

FIG. 8 is a cross-sectional diagram showing a synaptic device including the memristor device M10 according to one embodiment of the present invention.

Referring to FIG. 8, the second electrode 20 of the memristor device M10 may be connected to a pre-synaptic neuron circuit N1. The first electrode 10 of the memristor device M10 may be connected to a post-synaptic neuron circuit N2. A pre-spike signal may be applied to the second electrode 20 from a pre-synaptic neuron circuit N1. A synaptic signal, that is, a post-synaptic current, may flow through the first electrode 10 to a post-synaptic neuron circuit N2. A post-spike signal may be generated from a post-synaptic neuron circuit N2. As an electrical signal is applied between the first electrode 10 and the second electrode 20, a potentiation or depression phenomenon of the memristor device M10 described with reference to FIGS. 5 and 6 may occur.

Figure 9:
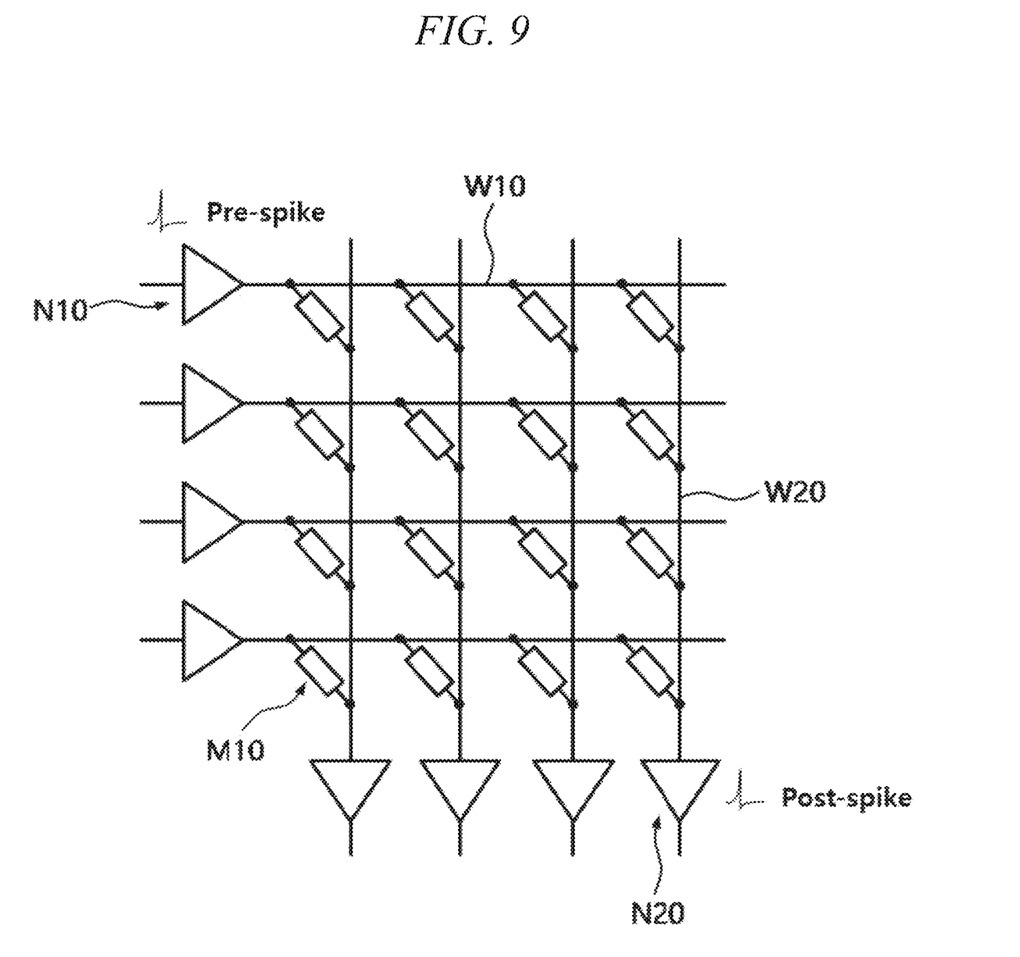
FIG. 9 is a circuit diagram showing a synaptic array device to which a memristor device M10 according to one embodiment of the present invention is applied.

FIG. 9 is a circuit diagram showing a synaptic array device to which a memristor device M10 made according to one embodiment of the present invention is applied.

Referring to FIG. 9, a plurality of memristor devices M10 may be arranged to constitute a plurality of columns and a plurality of rows. A plurality of first wires W10 may be arranged, and a plurality of second wires W20 intersecting with the first wires may be arranged, and a memristor device M10 may be provided at an intersection of the first wire W10 and the second wire W20. The plurality of first wirings W10 may be connected to the second electrode of the memristor device M10, and the plurality of second wirings W20 may be connected to the first electrode of the memristor device M10. The first wiring W10 may be connected to a pre-synaptic neuron circuit N10, and the second wiring W20 may be connected to a post-synaptic neuron circuit N20.

A pre-spike signal may be applied from the pre-synaptic neuron circuit N10 to the second electrode of the memristor device M10 through the first wiring W10. A synaptic signal, that is, a post-synaptic current, may flow to the post-synaptic neuron circuit N20 through the first electrode of the memristor device M10. A post-spike signal may be generated from a post-synaptic neuron circuit N20.

According to another embodiment of the present invention, a neuromorphic device and system to which the synaptic device or synapse device according to the above-described examples and embodiments is applied may be configured. Since the configuration of a neuromorphic device and a system to which the synaptic device is applied widely known, a detailed description thereof will be omitted. In one embodiment of the present invention, the performance of a neuromorphic device/system and a recognition rate may be improved by applying a synaptic device using a memristor device having excellent analog switching characteristics, symmetric synaptic characteristics, and stable and reliable synaptic characteristics to a neuromorphic device/system. Furthermore, an intelligent electronic system capable of more efficiently processing unstructured data (shape, voice, text, etc.) may be implemented by constructing an artificial neural network based on the neuromorphic device/system.

In the present specification, preferred embodiments of the present invention have been disclosed, and although specific terms have been used, these are merely used in a general meaning to explain the technological content of the present invention and to aid understanding of the present invention. But, it is not intended to limit the scope of the present invention. For those having a common knowledge in the related art, other modifications based on the technological concepts of the present invention may be implemented in addition to the embodiments disclosed herein. Those having a common knowledge in the related art will understand that a memristor device, a fabricating method thereof, a synaptic device including memristor device, and a neuromorphic device including synaptic device which are described with reference to FIGS. 1, 2, and 4 to 9, and the like may be substituted, changed, and modified within the scope of the technological concepts of the present invention. Therefore, the scope of the invention should not be determined by the described embodiments.

EXPLANATION OF SYMBOLS

Description of symbols for the main parts of the drawing
10: first electrode 15: resistance change layer
20: second electrode 100: substrate
M10: memristor element N1: pre-synaptic neuron circuit
N2: post-synaptic neuron circuit
N10: pre-synaptic neuron circuit
N20: post-synaptic neuron circuit
W10: first wiring W20: second wiring

What is claimed is:

1. A memristor device comprising:
a first electrode;
a second electrode disposed to be spaced apart from the first electrode; and
a resistance change layer including a copolymer between the first electrode and the second electrode;
wherein the copolymer is a copolymer of a first monomer and a second monomer, and a first metal ion diffusivity of a first polymer formed from the first monomer is faster than a second metal ion diffusivity of a second polymer formed from the second monomer.

2. The memristor device of the claim 1, wherein the first monomer includes vinylimidazole (VI).

3. The memristor device of the claim 1, wherein the second monomer includes 1,3,5-trivinyl-1,3,5-trimethylcyclotrisiloxane (V3D3).

4. The memristor device of the claim 1, wherein the first monomer includes VI, the second monomer includes V3D3, and the copolymer includes p(V3D3-co-VI).

5. The memristor device of claim 1, wherein a content of the first monomer in the copolymer is about 15% to 70%.

6. The memristor device of claim 1, wherein a content of the first monomer in the copolymer is determined from a molecular ratio percentage calculation.

7. The memristor device of claim 1, wherein one of the first electrode and the second electrode is an inert electrode, and the other is an active electrode.

8. The memristor device of the claim 7, wherein the inert electrode includes at least any one selected from Al and Pt.

9. The memristor device of the claim 7, wherein the active electrode includes at least any one selected from Cu, Ag, and Ni.

10. The memristor device of claim 1, wherein the resistance change layer is a single layer formed from the copolymer, the first electrode is in contact with a first surface of the single layer, and the second electrode is in contact with a second surface facing the first surface of the single layer.

11. The memristor device of claim 1, wherein the resistance change layer has a thickness of about 5 nm to 100 nm.

12. A neuromorphic device having synaptic array, the synaptic array comprising:
a plurality of memristor devices arranged to constitute a plurality of columns and a plurality of rows;
a plurality of first wires; and
a plurality of second wires intersecting with the first wires,
wherein each mem resistor device comprises
opposing electrodes disposed to be spaced apart from each other, and
a resistance change layer including a copolymer between the opposing electrodes,
wherein the copolymer is a copolymer of a first monomer and a second monomer, and a first metal ion diffusivity of a first polymer formed from the first monomer is faster than a second metal ion diffusivity of a second polymer formed from the second monomer, and
wherein
the memristor devices are provided at intersections of the first wires and the second wires, and
the plurality of first wires and the plurality of second wirings are connected respectively to the opposing electrodes of the memristor devices.

* * * * *